(12) United States Patent
Yasuda

(10) Patent No.: US 9,735,393 B2
(45) Date of Patent: *Aug. 15, 2017

(54) ORGANIC ELECTROLUMINESCENT DISPLAY DEVICE

(71) Applicant: Sharp Kabushiki Kaisha, Osaka (JP)

(72) Inventor: Yuki Yasuda, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/286,360

(22) Filed: Oct. 5, 2016

(65) Prior Publication Data

US 2017/0025639 A1 Jan. 26, 2017

Related U.S. Application Data

(63) Continuation of application No. 14/423,579, filed as application No. PCT/JP2013/004959 on Aug. 22, 2013, now Pat. No. 9,478,766.

(30) Foreign Application Priority Data

Aug. 29, 2012 (JP) ................. 2012-188986

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 51/0096* (2013.01); *H01L 51/504* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5246* (2013.01); *H01L 51/56* (2013.01); *H01L 51/004* (2013.01); *H01L 51/006* (2013.01);
(Continued)

(58) Field of Classification Search
CPC ....... H01L 33/005; H01L 33/02; H01L 33/36; H01L 33/44; H01L 33/48; H01L 51/0037
See application file for complete search history.

(56) References Cited

U.S. PATENT DOCUMENTS 9,478,766 B2 * 10/2016 Yasuda ............... H01L 51/5246
2009/0261720 A1 10/2009 Shinto

FOREIGN PATENT DOCUMENTS

JP 2007-59094 A 3/2007
JP 2008-59868 A 3/2008
(Continued)

*Primary Examiner* — Kyoung Lee
(74) *Attorney, Agent, or Firm* — Chen Yoshimura LLP

(57) ABSTRACT

An organic electroluminescent display device has a display region where image display is performed and a frame region surrounding said display region. The organic electroluminescent display device includes: a first substrate; a second substrate disposed facing said first substrate; an organic electroluminescent element provided on said first substrate in the display region; and a sealing film on said first substrate in the frame and display regions so as to cover said organic electroluminescent element, a surface of the sealing film in the frame region being hydrophilic.

9 Claims, 6 Drawing Sheets

(51) Int. Cl.
*H01L 51/50* (2006.01)
*H01L 51/56* (2006.01)
*H01L 51/00* (2006.01)

(52) U.S. Cl.
CPC ...... *H01L 51/0034* (2013.01); *H01L 51/0035* (2013.01); *H01L 51/0058* (2013.01); *H01L 51/0059* (2013.01); *H01L 51/0071* (2013.01); *H01L 51/0081* (2013.01); *H01L 2227/323* (2013.01); *H01L 2251/301* (2013.01); *H01L 2251/303* (2013.01)

(56) References Cited

FOREIGN PATENT DOCUMENTS

| | | |
|---|---|---|
| JP | 2008-130355 A | 6/2008 |
| JP | 2010-33734 A | 2/2010 |
| JP | 2011-3285 A | 1/2011 |

* cited by examiner

ORGANIC ELECTROLUMINESCENT DISPLAY DEVICE

TECHNICAL FIELD

The present invention relates to a method of manufacturing an organic EL display device provided with an organic electroluminescence element (hereinafter, "organic EL element") and an organic EL display device manufactured using this method.

BACKGROUND ART

In recent years, liquid crystal display devices have widely been used as flat-panel display devices in many fields. However, significant problems remain, such as significant variation in contrast and coloring depending on the angle of view, difficulty in achieving low power consumption due to the requirement for a light source such as a back light, and limits to the degree of thinness and lightweightness which can be achieved. Another significant problem which remains relates to making liquid crystal display devices flexible.

Accordingly, in recent years there are high hopes for self-illuminating organic EL display devices having organic EL elements as display devices to replace liquid crystal display devices. Organic EL elements are such that organic molecules constituting an organic EL source light up when a current is caused to flow to the organic EL layer, which is sandwiched between an anode and a cathode. An organic EL display device using this organic EL element is self-illuminating and therefore has outstanding thinness, lightweightness, and low power consumption, and moreover has a wide angle of view, and has therefore attracted a great deal of attention as a candidate for a next-generation flat-panel display. Furthermore, such organic EL display devices have the potential to be superior to liquid crystal display devices as relates to flexibility. Indeed, practical implementation of such organic EL display devices has been spreading as a main display for portable music devices and portable telephones, taking advantage of its thinness and wide angle of view.

In general, when organic EL elements are operated for a certain amount of time, light emittance characteristics such as light emittance luminance, uniformity of light emittance, and the like, drop noticeably compared to when first used. Examples of causes of deterioration of such light emittance characteristics include deterioration of an organic layer due to moisture from outside entering an interior of the organic EL element, oxidation of electrodes caused by oxygen in the atmosphere, and separation of the organic layer from the electrodes caused by this moisture or oxygen.

Accordingly, organic EL display devices have been proposed, which are provided with a sealing film for protecting the organic EL element from moisture and oxygen, and sealing member for sealing in the organic EL element. More specifically, for example, an organic EL display device has been proposed which is provided with an element substrate such as a glass substrate, a sealing substrate such as a glass substrate opposing the element substrate, an organic EL element formed on the element substrate and provided between the element substrate and the sealing substrate, a sealing film provided so as to cover the organic EL element in order to protect the organic EL element from moisture and oxygen, and a sealing member that is provided to the sealing film so as to seal the organic EL element and adheres the element substrate and the sealing substrate together (see Patent Document 1, for example).

RELATED ART DOCUMENT

Patent Document

Patent Document 1: Japanese Patent Application Laid-Open Publication No. 2010-33734

SUMMARY OF THE INVENTION

Problems to be Solved by the Invention

However, a configuration in which a sealing member is provided on a sealing film, like in the organic EL display device described in Patent Document 1, has a problem in that defects occur in the sealing member caused by an angle of contact between the sealing member and the sealing film in a step of adhering the sealing substrate on which the sealing member is formed and the element substrate on which the sealing film is formed, with the sealing member interposed therebetween, in a vacuum.

More specifically, in the case of an adhering step in which a sealing member formed on a sealing substrate is placed on a sealing film formed on an element substrate in a vacuum and the sealing film and the sealing member come into contact, if an angle of contact $\theta_1$ between a sealing member 52 and a sealing film 51 formed on an element substrate 50 is large, as shown in FIG. 14, then spreading characteristics of the sealing member 52 onto the sealing film 51 are reduced and adhesion between the sealing film 51 and the sealing member 52 drops, when moving a sealing substrate 53 towards the element substrate 50 (i.e., in the direction of the arrow X in the drawing) with the sealing member 52 sandwiched between the sealing film 51 and the sealing substrate 53, as shown in FIG. 15.

As a result, after adhering the element substrate 50 and the sealing substrate 53 with the sealing member 52 sandwiched therebetween in a vacuum, the sealing member 52 is easily pushed by outside pressure (the arrow Y shown in FIGS. 16 and 17) when returning to atmospheric pressure, as shown in FIGS. 16 and 17, and defects such as an indented portion 52a or a missing portion 52b occur in the sealing member 52 due to a difference between a pressure inside the sealing member 52 and outside pressure. Thus, a problem has existed whereby entry of moisture or oxygen from outside can then no longer be prevented with certainty by the sealing member 52, making prevention of deterioration of an organic EL element 54 impossible.

Accordingly, the present invention was devised in light of these problems, and has as an object to provide a method of manufacturing an organic EL display device in which occurrence of defects in a sealing member can be prevented and deterioration of an organic EL element can be prevented, and an organic EL display device manufactured using this method.

Means for Solving the Problems

To achieve this object, a method of manufacturing an organic electroluminescent display device of the present invention is a method of manufacturing an organic electroluminescent display device that includes: a first substrate; a second substrate disposed facing the first substrate; an organic electroluminescent element provided on the first substrate; a sealing film on the first substrate so as to cover the organic electroluminescent element, wherein a display region is defined in correspondence to the organic electroluminescent element and is where image display is performed, and a frame region is defined as a region surrounding the display region with respect to the organic electroluminescent display device; and a sealing member sandwiched between the first substrate and the second substrate in the frame region to adhere the substrates together, the method including: forming the organic electroluminescent element on the first substrate, forming the sealing film on the first substrate in the frame and display regions so as to cover the organic electroluminescent element, performing a hydrophilic treatment on a surface of the sealing film in the frame region, forming the sealing member on the second substrate, bonding the first substrate to the second substrate via the sealing member by placing the sealing member on the surface of the sealing film in the frame region in a vacuum state, and returning the vacuum state to atmospheric pressure.

With this configuration, the hydrophilic treatment is performed on the surface of the sealing film in the frame region, and therefore an angle of contact between the sealing member and the sealing film is made smaller. Accordingly, spreading characteristics of the sealing member onto the sealing film are improved, and adhesion between the sealing film and the sealing member is improved. Hence, when returning the vacuum to atmospheric pressure, the sealing member is not readily pushed by outside pressure, making prevention of occurrence of defects such as an indented portion or a missing portion in the sealing member caused by a difference in pressure inside the sealing member and the outside pressure possible. As a result, entry of moisture and oxygen from outside can be prevented with certainty by the sealing member, which makes prevention of deterioration of the organic EL element possible.

In the method of manufacturing an organic electroluminescent display device of the present invention, in the step of performing the hydrophilic treatment, a plasma treatment may be performed on the surface of the sealing film in the frame region.

With this configuration, in a case in which a CVD device is used to form the sealing film using a plasma CVD method, for example, after the sealing film is formed, the plasma process can be performed on the surface of the sealing film using the same CVD device. Accordingly, the plasma process can be performed on the surface of the sealing film without providing a new device.

In the method of manufacturing an organic electroluminescent display device of the present invention, in the step of performing the hydrophilic treatment, an ultraviolet irradiation treatment may be performed on the surface of the sealing film in the frame region.

With this configuration, the hydrophilic treatment can be performed on the surface of the sealing film at a lower cost than a case in which a plasma process is performed. Furthermore, in a case in which the sealing member is formed using a UV curing resin, the UV curing resin forming the sealing member can be cured by the device used for performing the UV irradiation process on the surface of the sealing film, and therefore formation of the sealing member becomes easy.

The method of manufacturing an organic electroluminescent display device of the present invention may further include, after the step of forming the sealing member, the step of providing a material for forming a filler member having getter functionality on the second substrate in an area enclosed by the sealing member, wherein, in the step of bonding the first substrate to the second substrate, the material for forming the filler member may be dispersed uniformly in the area enclosed by the sealing member so as to form the filler member on the sealing film in a manner that covers the sealing film.

With this configuration, the filler material having the getter function (a function for adsorbing oxygen and moisture) is formed, and therefore even greater prevention of deterioration of the organic EL element caused by oxygen or moisture is possible.

In the method of manufacturing an organic electroluminescent display device of the present invention, the filler member may contain a drying agent.

With this configuration, a moisture adsorption function of the filler material can be improved.

Furthermore, in an organic electroluminescent display device manufactured using the method of manufacturing an organic electroluminescent display device of the present invention, the same effect can be obtained as that achieved by the method of manufacturing an organic electroluminescent display device of the present invention. In this regard, the present disclosure also provides, in one aspect, an organic electroluminescent display device having a display region where image display is performed and a frame region surrounding said display region, the organic electroluminescent display device including a first substrate; a second substrate disposed facing said first substrate; an organic electroluminescent element provided on said first substrate in the display region; and a sealing film on said first substrate in the frame and display regions so as to cover said organic electroluminescent element, a surface of the sealing film in the frame region being hydrophilic.

Effects of the Invention

With the present invention, entry of moisture and oxygen from outside can be prevented with certainty by the sealing member, which makes prevention of deterioration of the organic EL element possible.

DETAILED DESCRIPTION OF EMBODIMENTS

Embodiments of the present invention are described in detail below with reference to the drawings. Note that the present invention is not limited to the embodiments below.

Figure 1:
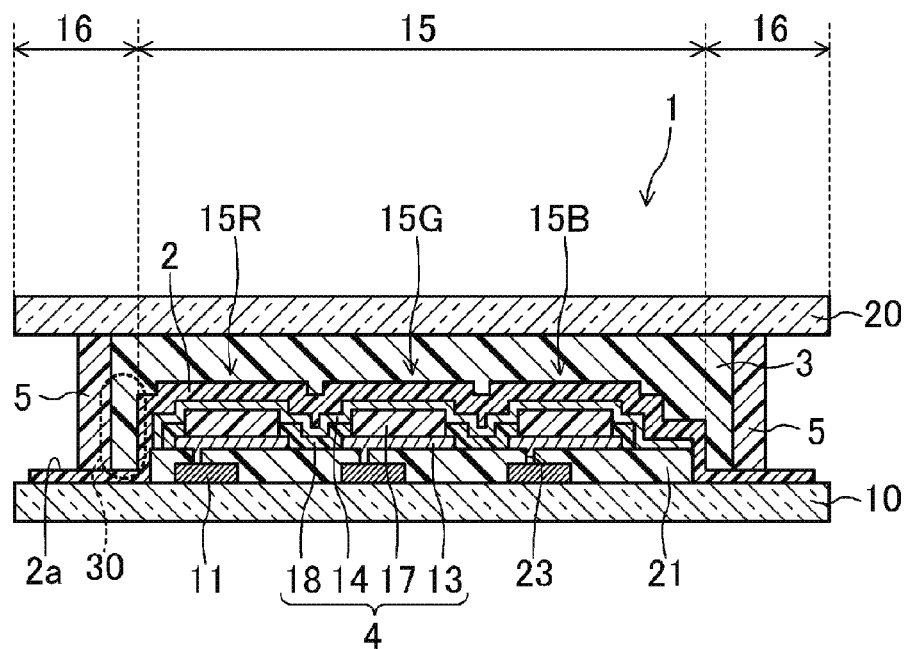
FIG. 1 is a cross-sectional view of an organic EL display device according to an embodiment of the present invention.
Figure 2:
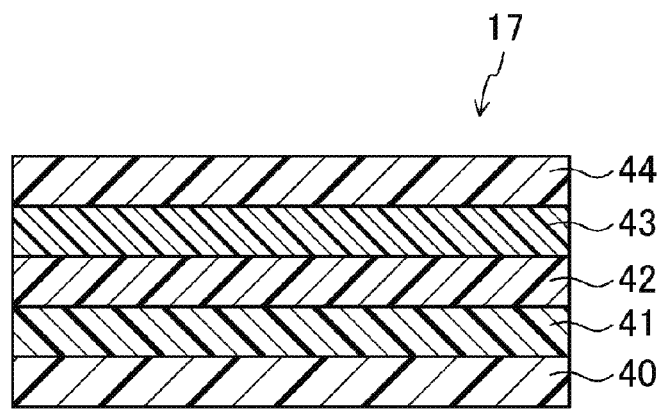
FIG. 2 is a cross-sectional view for describing an organic EL layer constituting an organic EL element provided to an organic EL display device according to an embodiment of the present invention.

FIG. 1 is a cross-sectional view of an organic EL display device according to an embodiment of the present invention, and FIG. 2 is a cross-sectional view for describing an organic EL layer constituting an organic EL element provided to an organic EL display device according to an embodiment of the present invention.

As shown in FIG. 1, an organic EL display device 1 is provided with an element substrate 10 which is a first substrate, a sealing substrate 20 which is a second substrate opposing the element substrate 10, and an organic EL element 4 which is formed on the element substrate 10 and is provided between the element substrate 10 and the sealing substrate 20.

Furthermore, the organic EL display device 1 is provided with a sealing member 5 which is provided between the element substrate 10 and the sealing substrate 20 and adheres the element substrate 10 and the sealing substrate 20 together so as to seal the organic EL element 4 therebetween.

The sealing member 5 is formed in a frame shape encircling the organic EL element 4, and the element substrate 10 and the sealing substrate 20 are adhered together with the sealing member 5 interposed therebetween.

The element substrate 10 and the sealing substrate 20 are formed by an insulating material such as, for example, glass or plastic.

Furthermore, as shown in FIG. 1, the organic EL display device 1 has a display region 15 in which the organic EL element 4 is arranged and which is enclosed by the sealing member 5. The organic EL element 4 is formed, disposed in a matrix, on a surface inside the display region 15 towards the element substrate 10 facing the sealing substrate 20. In the display region 15, a pixel region 15R which emits red light, a pixel region 15G which emits green light, and a pixel region 15B which emits blue light are arranged according to a prescribed pattern.

The organic EL element 4, as shown in FIG. 1, is provided with a plurality of first electrodes 13 (anodes) disposed in a prescribed arrangement (e.g., in a matrix) on the element substrate 10, organic EL layers 17 respectively formed on the plurality of the first electrodes 13, and a second electrode 14 formed on the organic EL layers 17.

Furthermore, the organic EL element 4 is provided with an edge cover 18 which is provided so as to cover outer edges of the first electrodes 13 and areas where the first electrodes 13 are not provided. The edge cover 18 is provided among pixel regions 15R, 15G, and 15B, and functions as a separating wall for delineating the pixel regions 15R, 15G, and 15B.

Furthermore, the organic EL display device 1, as shown in FIG. 1, is provided with TFTs 11 which are provided on the element substrate 10 and are each electrically connected with the plurality of the first electrodes 13, and an interlayer insulating film 21 which is formed on the element substrate 10 and covers the TFTs 11.

The first electrodes 13 have functionality for implanting holes (positive holes) in the organic EL layer 17. The first electrodes 13 are preferably formed from a material with a large work function. This is because by forming the first electrodes 13 from a material with a large work function, the efficiency of implanting the positive holes into the organic EL layer 17 can be improved. Furthermore, as shown in FIG. 1, the first electrodes 13 are formed on the interlayer insulating film 21.

Examples of materials constituting the first electrodes 13 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), or other metal materials. Alloys such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), or lithium fluoride (LiF)/calcium (Ca)/aluminum (Al), and so on are also possible. Moreover, the material may also be tin oxide (SnO), zinc oxide (ZnO), or a conductive oxide or the like, such as indium tin oxide (ITO) or indium zinc oxide (IZO).

Furthermore, the first electrodes 13 may be formed from a plurality of layers constituting the material. Examples of a material with a large work function include indium tin oxide (ITO), indium zinc oxide (IZO), or the like.

The interlayer insulating film 21 is formed on the element substrate 10 and has functionality for flattening film surfaces where the TFTs 11 are formed. With this interlayer insulating film 21, flattening the first electrodes 13, the organic EL layer 17, or the like formed on the interlayer insulating film 21 is possible. Specifically, steps or bumps in a bottom layer of the organic EL display device 1 are for affecting a shape of a surface of the first electrodes 13, and minimizing nonuniformity of light emitted from the organic EL layer 17. The interlayer insulating film 21 is constituted by an organic resin material such as acrylic resin or the like which has high transparency and is inexpensive.

Furthermore, as shown in FIG. 1, the first electrodes 13 are electrically connected to the TFTs 11 via contact holes 23 formed in the interlayer insulating film 21.

The organic EL layer 17 is formed on surfaces of the first electrodes 13 which are demarcated into a matrix. The organic EL layer 17, as shown in FIG. 2, is provided with a positive hole implantation layer 40, a positive hole transport layer 41 which is formed on a surface of the positive hole implantation layer 40, a light emitting layer 42 which is formed on a surface of the positive hole transport layer 41 and emits one of red light, green light, or blue light, an electron transport layer 43 which is formed on a surface of the light emitting layer 42, and an electron implantation layer 44 which is formed on a surface of the electron transport layer 43. The organic EL layer 17 is constituted by layering the positive hole implantation layer 40, the positive hole transport layer 41, the light emitting layer 42, the electron transport layer 43, and the electron implantation layer 44 in the stated order. Note that the organic EL layer 17 may be formed with an area smaller than the first electrodes 13 below, or may be formed with a larger area so as to cover the first electrodes 13.

The positive hole implantation layer 40 is also called an anode buffer layer and is used for improving positive hole implantation efficiency from the first electrodes 13 into the organic EL layer 17 by bringing closer together energy levels of the first electrodes 13 and the organic EL layer 17.

A triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, and so on can be used as a material that forms the positive hole implantation layer 40.

The positive hole transport layer 41 has functionality for improving transportation efficiency of positive holes from the first electrodes 13 to the organic EL layer 17. A porphyrin derivative, an aromatic tertiary amine compound, a styrylamine derivative, polyvinyl carbazole, poly-p-phenylene vinylene, polysilane, a triazole derivative, oxadiazole derivatives, an imidazole derivative, polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, or zinc selenide or the like can be used as a material which forms the positive hole transport layer 41.

The light emitting layer 42 is a region in which positive holes and electrons from both electrodes are implanted and the positive holes and the electrodes are recombined when a voltage is applied by the first electrodes 13 and the second electrodes 14. The light emitting layer 42 is formed from a material which has a high light emittance efficiency, for example, a metal oxinoid compound <8-hydroxyquinoline metal complex>, a naphthalene derivative, an anthracene derivative, a diphenylethylene derivative, a vinyl acetone derivative, a triphenylamine derivative, a butadiene derivative, a coumarin derivative, a benzoxazole derivative, a oxadiazole derivative, an oxazole derivative, a benzimidazole derivative, a thiadiazole derivative, a benzthiazole derivative, a styryl derivative, a styrylamine derivative, a bis-styrylbenzene derivative, a tris-styrylbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylene vinylene, or polysilane or the like can be used.

The electron transport layer 43 has a role of efficiently moving electrons to the light emitting layer. An oxadiazole derivative, a triazole derivative, a benzoquinone derivative, a naphthoquinone derivative, a anthraquinone derivative, a tetracyanoanthraquinodimethane derivative, an anthraquinodimethane derivative, a diphenoquinone derivative, a fluorenone derivative, a silole derivative, a metal oxinoid compound, or the like can be used as an organic compound, for example, as a material which forms the electron transport layer 43.

The electron implantation layer 44 is used to improve the efficiency with which electrons are implanted into the organic EL layer 17 from the second electrodes 14 by bringing closer together energy levels of the second electrodes 14 and the organic EL layer 17, whereby a drive voltage of the organic EL element 4 can be lowered. Note that the electron implantation layer is also called a cathode buffer layer. Inorganic alkali compounds such as lithium fluoride (LiF), magnesium fluoride ($MgF_2$), calcium fluoride ($CaF_2$), strontium fluoride ($SrF_2$), and barium fluoride ($BaF_2$), and $Al_2O_3$ and SrO can be used as a material that forms the electron implantation layer 44.

The second electrodes 14 have functionality for implanting electrons in the organic EL layer 17. The second electrodes 14 are preferably formed from a material with a small work function. This is because by forming the second electrodes 14 from a material with a small work function, the efficiency of implanting the electrons into the organic EL layer 17 can be improved. Furthermore, as shown in FIG. 1, the second electrodes 14 are formed on the organic EL layer 17.

Examples of materials constituting the second electrodes 14 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. Furthermore, the second electrodes 14 may be formed by alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al), and so on. Moreover, the second electrodes 14 may be formed by tin oxide (SnO), zinc oxide (ZnO), or a conductive oxide or the like, such as indium tin oxide (ITO) or indium zinc oxide (IZO). The second electrodes 14 can be formed by layering a plurality of layers constituting these materials.

Examples of materials with a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), or the like.

The edge cover 18 has functionality for preventing shorting between the first electrodes 13 and the second electrodes 14. Therefore, the edge cover 18 is preferably provided so as to completely enclose outer edges of the first electrodes 13.

Examples of materials constituting the edge cover 18 include silicon oxide ($SiO_2$), silicon nitrides ($SiN_x$ (x being a positive number)) such as a trisilicon tetranitride ($Si_3N_4$), silicon oxynitride (SiNO), and so on.

Furthermore, as shown in FIG. 1, the organic EL display device 1 is provided with a sealing film 2. The sealing film 2 is for protecting the organic EL element 4 from moisture and oxygen. The sealing film 2, as shown in FIG. 1, is provided on the element substrate 10 so as to cover the organic EL element 4.

There is no particular limitation on materials which form the sealing film 2, but examples include inorganic materials such as silicon oxide ($SiO_2$), aluminum oxide ($Al_2O_3$), silicon nitrides (SiNx (x being a positive number)) such as a trisilicon tetranitride ($Si_3N_4$), silicon carbonitride (SiCN), and organic materials such as acrylate, polyurea, parylene, polyimide, polyamide, and so on. Furthermore, from the perspective of thoroughly ensuring durability of the organic EL element 4, a thickness of the sealing film 2 is preferably 1 to 100 μm.

The organic EL display device 1, as shown in FIG. 1, is provided with a filler material 3 which has getter functionality (functionality for adsorbing oxygen and moisture). The filler material 3, as shown in FIG. 1, is provided on the sealing film 2 so as to cover the sealing film 2.

Examples of materials which form the filler material 3 include, for example, epoxy resin and silicon resin. Furthermore, from the perspective of improving moisture adsorption functionality, the filler material 3 contains an alkali earth metal oxide such as calcium oxide (CaO) or barium oxide (BaO) or a drying agent such as silica gel, zeolite, or the like.

The sealing member 5 which adheres the element substrate 10 and the sealing substrate 20 together is for securing the element substrate 10 and the sealing substrate 20. Examples of materials which form the sealing member 5 include, for example, a UV curing resin or a thermosetting resin such as epoxy resin and acrylic resin.

Furthermore, the organic EL display device 1, as shown in FIG. 1, is such that a frame region (seal material forming region) 16 in which the sealing member 5 is disposed is defined in a circumference of the display region 15, and this sealing member 5 is provided in a frame shape on the sealing film 2 so as to seal the organic EL element 4 in the frame region 16, and is constituted so as to adhere the element substrate 10 and the sealing substrate 20 together.

Next, an example of a method of manufacturing an organic EL display device of the present embodiment is described. FIGS. 3 to 13 are cross-sectional views for describing a method of manufacturing an organic EL display device according to an embodiment of the present invention.

Figure 3:
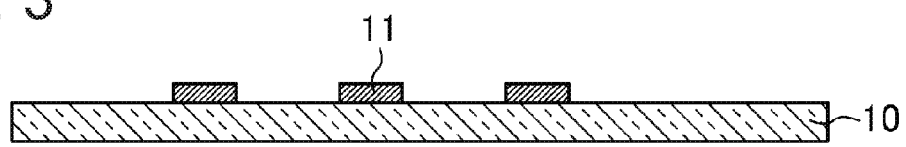
FIG. 3 is a cross-sectional view for describing a method of manufacturing an organic EL display device according to an embodiment of the present invention.

First, as shown in FIG. 3, a plurality of TFTs 11 for driving an organic EL element 4 are formed a prescribed distance apart on an element substrate 10, such as a glass substrate with a substrate size of 320×400 mm and a thickness of 0.7 mm.

Figure 4:
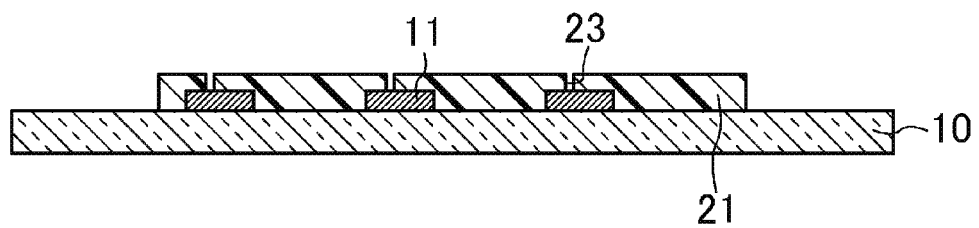
FIG. 4 is a cross-sectional view for describing a method of manufacturing an organic EL display device according to an embodiment of the present invention.

Next, as shown in FIG. 4, a photosensitive acrylic resin is applied to the element substrate 10 on which the TFTs 11 are formed by a spin coating method, an exposure mask having a prescribed exposure pattern is used to perform exposure with a prescribed exposure intensity (e.g., 360 mJ/$cm^2$), and an alkali developer agent is used for developing, thereby forming an interlayer insulating film 21 having a thickness of 2 μm, for example. Note that after developing, baking is performed as a post-bake under prescribed conditions (e.g., 60 min. at a temperature of 220° C.).

Note that at this time contact holes 23 (having, for example, a diameter of 5 μm) for electrically connecting first electrodes 13 and the TFTs 11 are formed in the interlayer insulating film 21.

Figure 5:
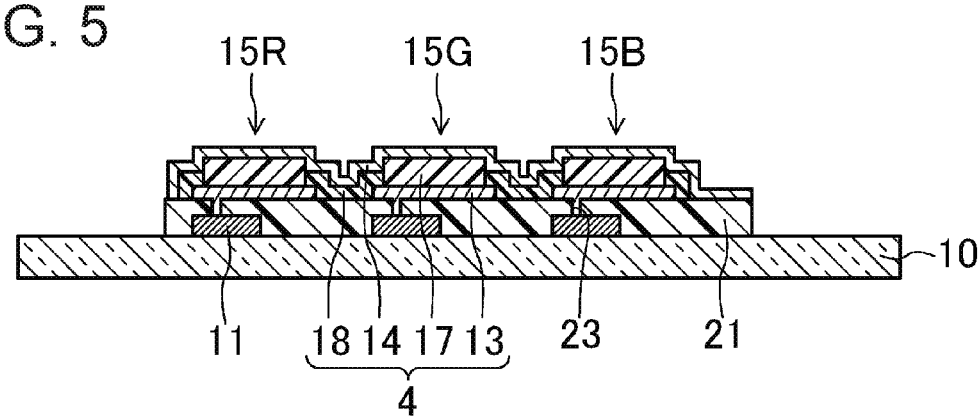
FIG. 5 is a cross-sectional view for describing a method of manufacturing an organic EL display device according to an embodiment of the present invention.

Next, as shown in FIG. 5, an ITO film is formed with a sputtering method, exposure and developing are performed with photolithography, and patterning is performed using etching, thereby forming a plurality of the first electrodes 13 on the interlayer insulating film 21. Here, a film thickness of the first electrodes 13 is formed to around 100 nm, for example. Note that after developing, baking is performed as a post-bake under prescribed conditions (e.g., 120 min. at a temperature of 220° C.). Furthermore, the first electrodes 13 are electrically connected to the TFTs 11 via the contact holes 23 formed in the interlayer insulating film 21.

Next, as shown in FIG. 5, a silicon oxide film is formed on outer edge portions of the first electrodes 13 with a sputtering method, exposure and developing are performed with photolithography, and patterning is performed using etching, thereby forming an edge cover 18 so as to completely enclose the outer edge portions of the first electrodes 13. Here, a thickness of the edge cover 18 is formed to around 150 nm, for example.

Next, an organic EL layer 17 including a light emitting layer 42 is formed on the first electrodes 13, and then the second electrodes 14 are formed on the organic EL layer 17. Formation of the organic EL layer 17 and the second electrodes 14 is performed using a metal mask and evaporation deposition.

More specifically, first, the element substrate 10 provided with the first electrodes 13 shown in FIG. 5 is placed into a chamber of an evaporation deposition device. Note that the interior of the chamber of the evaporation device is maintained at a vacuum of $1\times10^{-5}$ to $1\times10^{-4}$ (Pa) by a vacuum pump. Furthermore, the element substrate 10 provided with the first electrodes 13 is mounted with two sides secured by a pair of substrate holders installed inside the chamber.

Deposition materials for a positive hole implantation layer 40, a positive hole transport layer 41, a light emitting layer 42, an electron transport layer 43, and an electron implantation layer 44 are evaporated in order from a deposition source, which layers the positive hole implantation layer 40, the positive hole transport layer 41, the light emitting layer 42, the electron transport layer 43, and the electron implantation layer 44, thereby forming the organic EL layer 17 in a pixel area, as shown in FIG. 5.

Then, as shown in FIG. 5, the second electrodes 14 are formed on the organic EL layer 17, thereby forming the organic EL element 4 provided with the first electrodes 13, the organic EL layer 17, the second electrodes 14, and the edge cover 18 on the element substrate 10.

Note that crucibles filled with the evaporation materials, for example, can be used as the evaporation source. The crucibles are installed in a bottom part of the chamber, the crucibles are provided with heaters, and the crucibles are heated by the heaters.

The deposition materials in the crucibles evaporate and fly up inside the chamber when interior temperatures of the crucibles reach evaporation temperatures of the deposition materials due to the heating by the heaters.

Furthermore, a specific example of a method of forming the organic EL layer 17 and the second electrodes 14 is first forming the positive hole implantation layer 40 constituted of m-MTDATA (4,4,4-tris(3-methylphenylphenylamino)triphenylamine) via a mask to a thickness of, for example, 25 nm in common for all RGB pixels on the first electrodes 13 patterned on the element substrate 10.

Next, the positive hole transport layer 41 constituted of α-NPD (4,4-bis(N-1-naphthyl-N-phenylamino)biphenyl) is formed via a mask to a thickness of, for example, 30 nm in common for all RGB pixels on the positive hole implantation layer 40.

Next, as a red light emitting layer 42, a mixture in which 30 wt. % of 2,6-bis ((4'-methoxy-diphenyl-amino)styryl)-1, 5-dicyanonaphthalene (BSN) is mixed into di(2-naphthyl) anthracene (ADN) is formed via a mask to a thickness of, for example, 30 nm on the positive hole transport layer 41 formed in the pixel region.

Next, as a green light emitting layer 42, a mixture in which 5 wt. % of coumarin 6 is mixed into ADN is formed via a mask to a thickness of, for example, 30 nm on the positive hole transport layer 41 formed in the pixel region.

Next, as a blue light emitting layer 42, a mixture in which 2.5 wt. % of 4,4'-bis(2-{4-(N,N-diphenylamino)phenyl}vinyl)biphenyl (DPAVBi) is mixed into ADN is formed via a mask to a thickness of, for example, 30 nm on the positive hole transport layer 41 formed in the pixel region.

Next, 8-hydroxyquinoline aluminum (Alq3) is formed via a mask to a thickness of, for example, 20 nm as the electron transport layer 43 in common to all RGB pixels on the light emitting layers 42.

Next, lithium fluoride (LiF) is formed via a mask to a thickness of, for example, 0.3 nm as the electron implantation layer 44 on the electron transport layer 43.

Then the second electrodes 14 constituted of aluminum (Al) are formed to a thickness of, for example, 10 nm as the second electrodes 14 by vacuum evaporation.

Figure 6:
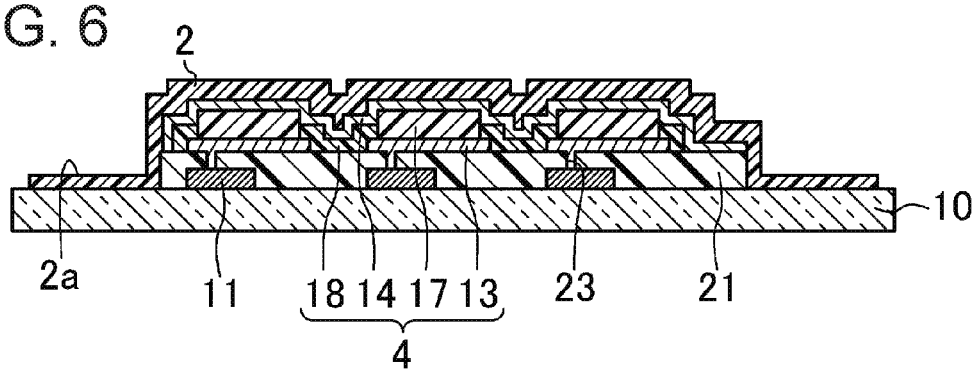
FIG. 6 is a cross-sectional view for describing a method of manufacturing an organic EL display device according to an embodiment of the present invention.

Next, as shown in FIG. 6, the sealing film 2 is formed on the element substrate 10 so as to cover the organic EL element 4. The sealing film 2 can be formed by layering an inorganic material such as silicon oxide ($SiO_2$) or aluminum oxide ($Al_2O_3$) or the like, for example, on surfaces of the element substrate 10 and the organic EL element 4 with a plasma CVD method, a vacuum evaporation method, a sputtering method, or the like. Furthermore, an organic material such as acrylate, polyurea, parylene, polyimide, polyamide, or the like can be formed by layering on surfaces of the element substrate 10 and the organic EL element 4 by vacuum evaporation or the like. Note that the sealing film 2 can be formed as a single layer including one of the above materials or as a layered film including two or more of the materials.

Figure 7:
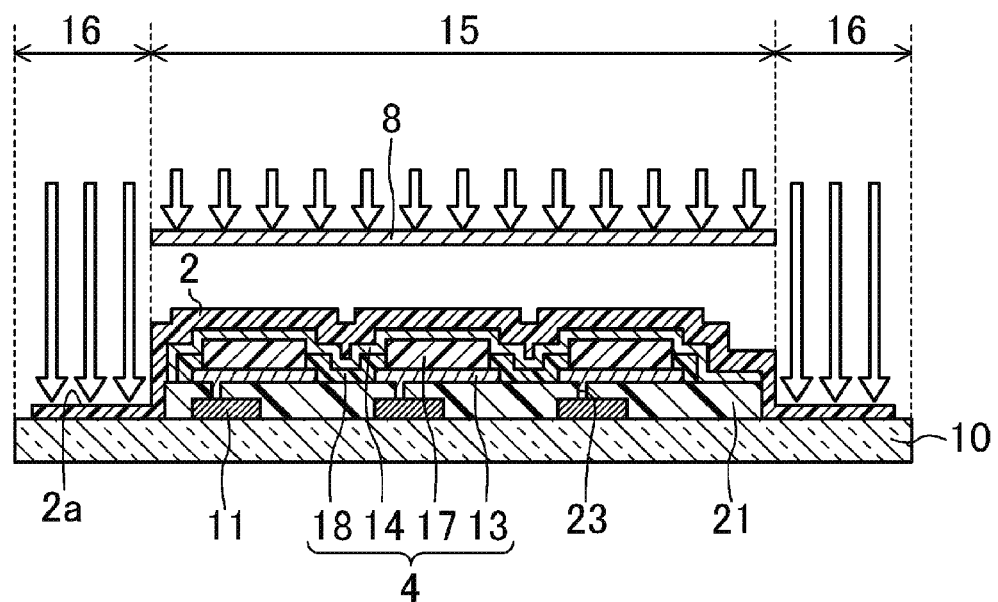
FIG. 7 is a cross-sectional view for describing a method of manufacturing an organic EL display device according to an embodiment of the present invention.

Next, a hydrophilic treatment is performed on a surface of the sealing film 2 in the frame region 16. More specifically, as shown in FIG. 7, first a mask (e.g., a metal mask of SUS or titanium (Ti) or the like, being a mask in which a portion corresponding to the frame region (sealing member formation region) 16 is open) 8 is disposed on a display region 15. Next, for example, hydrogen gas, argon gas, or ammonia gas is used as a raw gas to perform a surface treatment (i.e., a plasma process shown by the arrows in FIG. 7) on a surface 2a of the sealing film 2 by applying a hydrophilic function group (—COOH, —C=O, etc.) of the raw gas occurring in a normal-pressure plasma for a prescribed amount of time (60 seconds, for example), thereby performing the hydrophilic treatment on the surface 2a of the sealing film 2 in the frame region 16.

Figure 8:
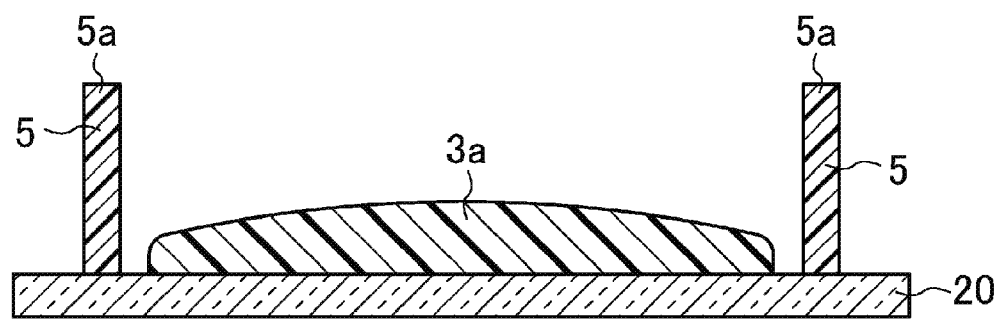
FIG. 8 is a cross-sectional view for describing a method of manufacturing an organic EL display device according to an embodiment of the present invention.
Figure 9:
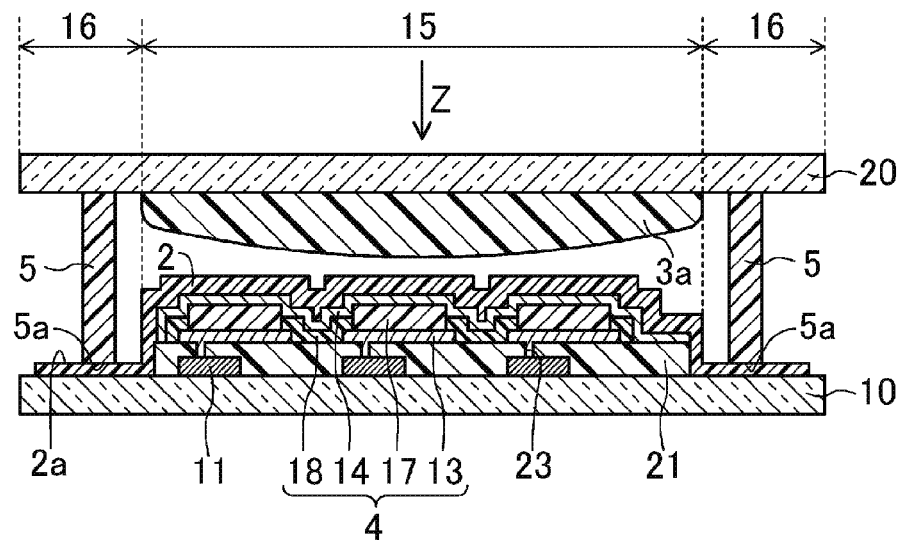
FIG. 9 is a cross-sectional view for describing a method of manufacturing an organic EL display device according to an embodiment of the present invention.

Next, as shown in FIG. 8, a material such as the epoxy resin or the like is applied to a sealing substrate 20, such as a glass substrate having a substrate size of 730 mm×920 mm and a thickness of 0.7 mm, by a dispenser or a mask printing method, a screen printing method, or the like, forming the sealing member 5 in a frame shape.

Note that spacers (not shown in the drawings) for regulating the distance between the element substrate 10 and the sealing substrate 20 are mixed into the sealing member 5. The spacers are formed from $SiO_2$ (silicon oxide), for example.

Furthermore, in the present embodiment, an epoxy resin is preferably used as a material which forms the sealing member 5, and a material having a viscosity of 100 to 1000 Pa/s is used, but the viscosity is not limited to this range as long as the viscosity is sufficient to allow drawing by the dispenser or patterning by screen printing or the like.

Furthermore, when using an epoxy resin as the material forming the sealing member 5, an epoxy resin having drying functionality may be used. It is preferable that material which does not produce (or has little) outgassing be used when hardening the sealing member 5, and it is preferable that a material with low contraction be used when hardening the sealing member 5 from the perspective of avoiding damage to the light emitting layer 42.

Furthermore, it is preferable that a material which can be hardened at 100° C. or below be used, taking into consideration effects of heat on the light emitting layer 42 when using a thermosetting material as a material forming the sealing member 5. Furthermore, it is preferable that moisture permeability of the sealing member 5 be low.

Next, a material 3a (containing the aforementioned drying agent) for forming the filler material 3 is applied to the inside of the sealing member 5 formed on the sealing substrate 20 away from the sealing member 5 by a dispenser, a mask printing method, a drip injection method, or the like. Note that a configuration may be used in which a sheet-like material is used instead of the application-type material 3a.

Next, in a vacuum, the sealing substrate 20 on which the sealing member 5 is formed is overlaid onto the element substrate 10 on which the organic EL element 4 is formed such that the organic EL element 4 and the material 3a are overlaid, and a surface 5a of the sealing member 5 formed on the sealing substrate 20 is placed on the surface 2a of the sealing film 2 in the frame region 16.

Figure 10:
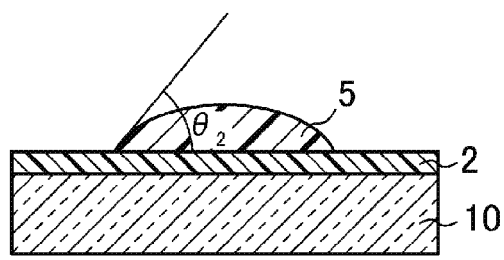
FIG. 10 is a cross-sectional view for describing a method of manufacturing an organic EL display device according to an embodiment of the present invention.
Figure 14:
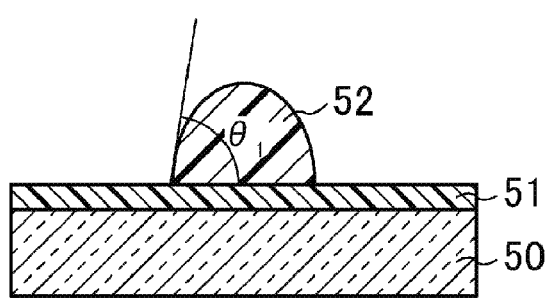
FIG. 14 is a cross-sectional view for describing a conventional method of manufacturing an organic EL display device.
Figure 15:
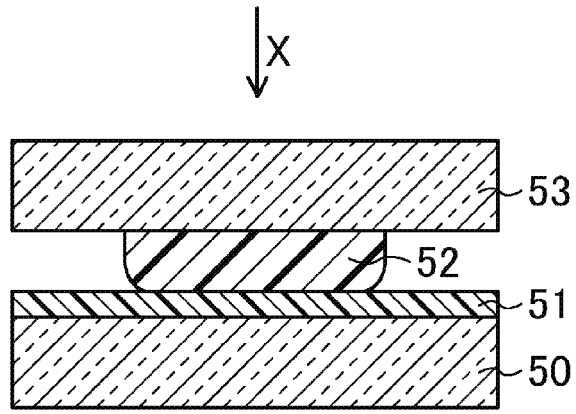
FIG. 15 is a cross-sectional view for describing a conventional method of manufacturing an organic EL display device.
Figure 16:
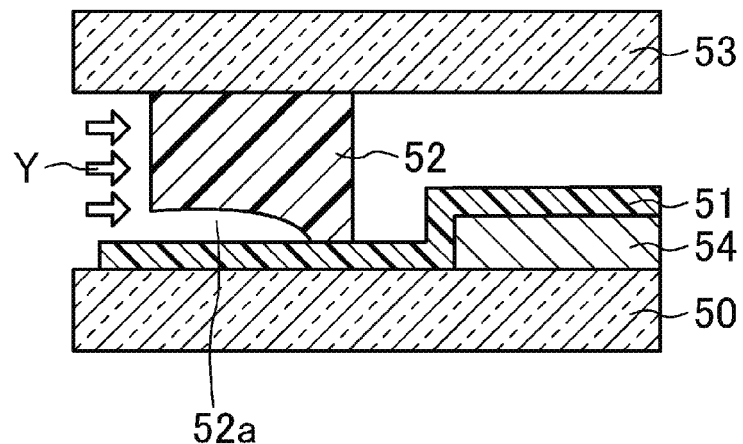
FIG. 16 is a cross-sectional view for describing a conventional method of manufacturing an organic EL display device.
Figure 17:
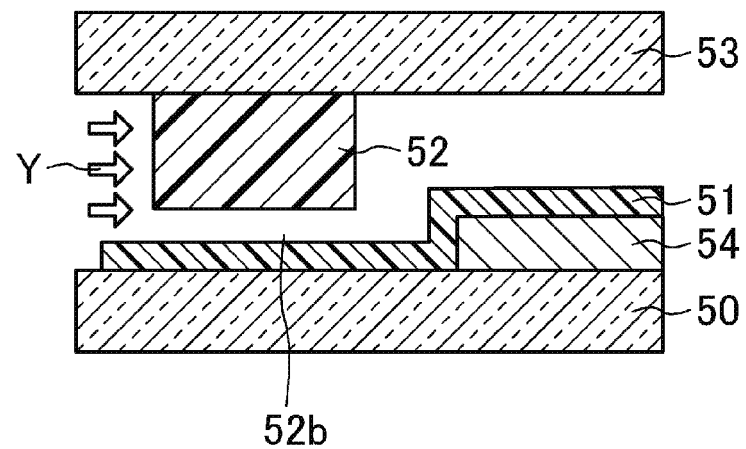
FIG. 17 is a cross-sectional view for describing a conventional method of manufacturing an organic EL display device.

When doing so, as described above, since the hydrophilic treatment has been performed on the surface 2a of the sealing film 2 in the frame region 16 as described above, an angle of contact $\theta_2$, as shown in FIG. 10, between the sealing member 5 and the sealing film 2 formed on the element substrate 10 is smaller than in the conventional case shown in FIG. 14 (i.e., $\theta_1 > \theta_2$).

Figure 11:
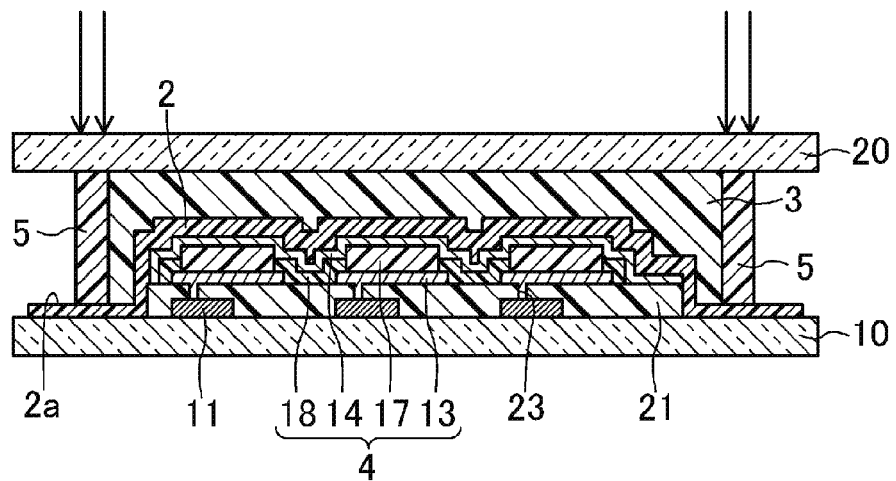
FIG. 11 is a cross-sectional view for describing a method of manufacturing an organic EL display device according to an embodiment of the present invention.
Figure 12:
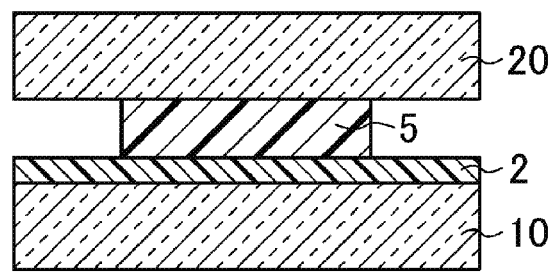
FIG. 12 is a cross-sectional view for describing a method of manufacturing an organic EL display device according to an embodiment of the present invention.

Next, maintaining an airtight vacuum state inside the sealing member 5 under prescribed conditions (e.g., pressure of 100 Pa or less), the sealing substrate 20 is moved towards the element substrate 10 (i.e., in the direction of the arrow Z in FIG. 9), with the sealing member 5 sandwiched between the sealing film 2 and the sealing substrate 20 in a vacuum and a pressurizing process is performed, thereby causing the element substrate 10 and the sealing substrate 20 to be adhered together with the sealing member 5 interposed therebetween, and forming an adhered body in which the element substrate 10 and the sealing substrate 20 are adhered together, as shown in FIG. 11.

When adhering the element substrate 10 and the sealing substrate 20 together, the pressurization causes the material 3a for the filler material 3 formed on a surface of the sealing substrate 20 to disperse uniformly inside the sealing member 5, and the filler material 3 is formed on the sealing film 2 so as to cover the sealing film 2, as shown in FIG. 11.

When doing this, the angle of contact $\theta_2$ between the sealing member 5 and the sealing film 2 formed on the element substrate 10 is small, as described above, and therefore, as shown in FIG. 12, spreading of the sealing member 5 over the sealing film 2 is improved and adhesion between the sealing film 2 and the sealing member 5 is improved.

Next, after purging the vacuum state to atmospheric pressure (i.e., returning to atmospheric pressure), as shown in FIG. 11 UV light (the arrow in FIG. 11) is radiated from the sealing substrate 20, hardening the resin forming the sealing member 5, and the organic EL display device 1 shown in FIG. 1 is manufactured.

When doing so, as described above, spreading of the sealing member 5 to the sealing film 2 is improved and adhesion between the sealing film 2 and the sealing member 5 is improved, and therefore the sealing member 5 is less readily pushed by outside air pressure when returning to atmospheric pressure. Accordingly, unlike the conventional art described above, preventing occurrence of defects such as indented portions or missing portions, etc., in the sealing member 5 caused by a difference between pressure inside the sealing member 5 and outside pressure is possible. As a result, entry of moisture and oxygen from outside can be prevented with certainty by the sealing member 5.

In other words, in the present embodiment, the hydrophilic process is performed on the surface (i.e., surface of contact with the sealing member 5) 2a of the sealing film 2 in the frame region 16 and adhesion is improved between the sealing film 2 and the sealing member 5, thereby making it possible to prevent occurrences of defects in the sealing member 5 and to prevent deterioration in the organic EL element 4.

Furthermore, the present embodiment, as shown in FIG. 1, is constituted such that the sealing film 2 and the filler material 3 are in contact in an uneven-height portion 30 formed by the sealing film 2 in the frame region 16, but because the hydrophilic process has been performed on the surface (i.e., the surface in contact with the filler material 3) 2a of the sealing film 2 in the frame region 16 as described above, an angle of contact between the filler material 3 and the sealing film 2 is reduced. Accordingly, it is possible to prevent occurrence of bubbles in the filler material 3 caused by the sealing film 2 pushing away the filler material 3.

Note that the above embodiment may be modifies as follows.

Figure 13:
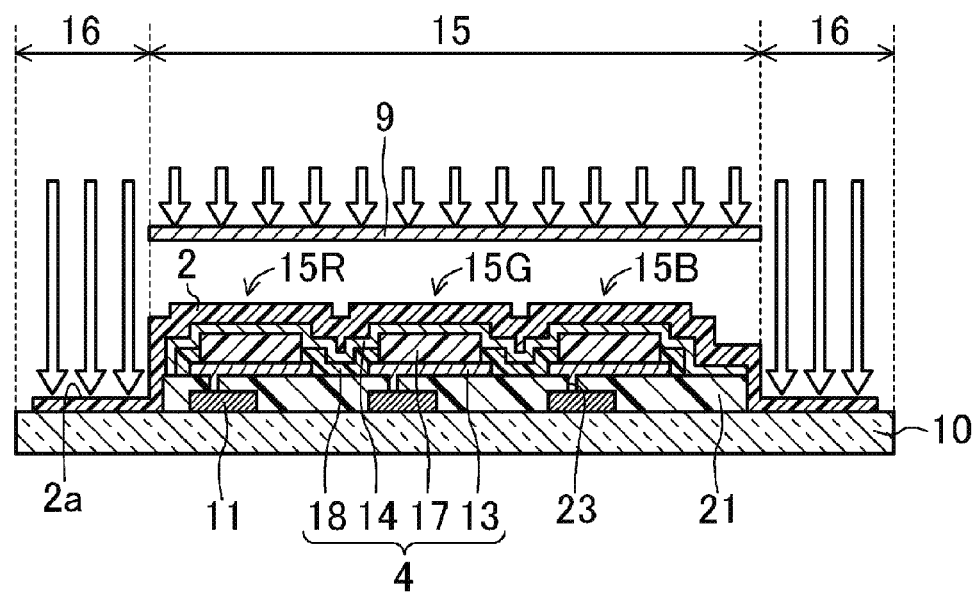
FIG. 13 is a cross-sectional view for describing a method of manufacturing an organic EL display device according to a variation of the present invention.

The above embodiment was described as having a plasma process as an example of a method of a hydrophilic process, but a method of a hydrophilic process is not limited to the aforementioned plasma process, and, for example, a configuration may be used in which a hydrophilic process is performed on a surface 2a of a sealing film 2 in a frame region 16 by a UV irradiation process. For example, first, as shown in FIG. 13, a mask (e.g., a mask of a metal such as chromium (Cr) or the like, being a mask which is patterned so as to cover the display region 15) 9 is placed on a display region 15. Next, for example, the surface 2a of the sealing film 2 in the frame region 16 is irradiated for 5 to 60 seconds with UV light at 185 nm, 245 m, or the like using a low-pressure mercury lamp of 100 to 200 W or with UV light at 172 nm or the like using a Xe excimer lamp, thus performing surface treatment (i.e., UV irradiation treatment shown in the arrows in FIG. 13), thereby making it possible to perform a hydrophilic process on the surface 2a of the sealing film 2 in the frame region 16.

Furthermore, in the above embodiment, a five-layer structure was used for the organic EL layer 17, with the positive hole implantation layer 40, the positive hole transport layer 41, the light emitting layer 42, the electron transport layer 43, and the electron implantation layer 44, but the present invention is not limited to this five-layer structure, and may used a three-layer structure of a positive hole implantation layer-cum-positive hole transport layer, a light emitting layer, and an electron transport layer-cum-electron implantation layer, for example.

Furthermore, the layered structure can be inverted, with the first electrodes 13 being cathodes and the second electrodes 14 being anodes. In this case, the layered structure is, from the bottom, the first electrodes 13, which are the cathode, the electron implantation layer 44, the electron transport layer 43, the light emitting layer 42, the positive hole transport layer 41, the positive hole implantation layer 40, and the second electrodes 14, which are the anode.

Furthermore, in this case, the materials used for the first electrodes 13 and the second electrodes 14 are reversed.

Furthermore, the embodiment above was described, using the organic EL display device 1 as an example of a display device, but the present invention is also applicable to other display devices, such as liquid crystal display devices and the like, for example.

For example, in a case in which the present invention is applied to a liquid crystal display device provided with a TFT substrate which is a first substrate, a CF substrate which is a second substrate disposed facing the TFT substrate, a liquid crystal layer which is a display medium layer provided sandwiched between the TFT substrate and the CF substrate, a sealing member sandwiched between the TFT substrate and the CF substrate, adhering the TFT substrate and the CF substrate together and provided in a frame shape for sealing in the liquid crystal layer, a display region in which image display is performed, and a frame region around the display region in which the sealing member is disposed (sealing member forming region), the aforementioned hydrophilic process is performed on a surface of the TFT substrate in the frame region (i.e., a surface of an insulating substrate such as a glass substrate or the like provided to the TFT substrate) or a surface of the CF substrate (i.e., a surface of an insulating substrate such as a glass substrate or the like provided to the CF substrate), and adhesion between the insulating substrate and the sealing member is improved, thereby making it possible to prevent occurrence of defects in the sealing member.

INDUSTRIAL APPLICABILITY

As described above, the present invention is suited to a method of manufacturing an organic EL display device provided with an organic EL element, and to an organic EL display device manufactured by this method.

DESCRIPTION OF REFERENCE CHARACTERS 1 organic EL display device
2 sealing film
2a surface of sealing film
3 filler material
3a material of the filler material
4 organic EL element
5 sealing member
5a surface of sealing member
10 element substrate
11 TFT
15 display region
16 frame region
17 organic EL layer
18 edge cover
20 sealing substrate
21 interlayer insulating film

What is claimed is:
1. An organic electroluminescent display device having a display region where image display is performed and a frame region surrounding said display region, the organic electroluminescent display device comprising:
a first substrate;
a second substrate disposed facing said first substrate;
an organic electroluminescent element provided on said first substrate in the display region; and
a sealing film on said first substrate in the frame and display regions so as to cover said organic electrolu- minescent element, a surface of the sealing film in the frame region being hydrophilic.

2. The organic electroluminescent display device according to claim 1, further comprising:
a thin film transistor on the first substrate; and
an interlayer insulating film on the thin film transistor and below the organic electroluminescent element, the interlayer insulating film being made of an organic resin.

3. The organic electroluminescent display device according to claim 2, wherein the interlayer insulating film does not overlap the sealing film in the frame region having said hydrophilic surface in a plan view.

4. The organic electroluminescent display device according to claim 1,
wherein the organic electroluminescent element is provided in plurality, and the plurality of the organic electroluminescent elements comprise a plurality of first electrodes disposed in a prescribed arrangement, organic electroluminescent layers respectively formed on the plurality of first electrodes, and a second electrode formed on the organic electroluminescent layers, and
wherein the second electrode does not overlap the sealing film in the frame region having said hydrophilic surface in a plan view.

5. The organic electroluminescent display device according to claim 1, wherein the sealing film is a single inorganic layer made of silicon oxide, aluminum oxide, silicon nitride, or silicon carbonitride, or is a multilayered inorganic film including at least two of silicon oxide, aluminum oxide, silicon nitride, and silicon carbonitride.

6. The organic electroluminescent display device according to claim 5, wherein said single inorganic layer of said multilayered inorganic film is formed by a plasma CVD method.

7. The organic electroluminescent display device according to claim 1, wherein the sealing film is a single organic layer made of acrylate, polyurea, parylene, polyimide, or polyamide, or is a multilayered organic film including at least two of acrylate, polyurea, parylene, polyimide, and polyamide.

8. The organic electroluminescent display device according to claim 1, wherein the sealing film is a multilayered film including an inorganic material and an organic material.

9. The organic electroluminescent display device according to claim 1, wherein the first and second substrates are made of an insulating plastic material.

* * * * *